United States Patent [19]

Buettner et al.

[11] Patent Number: 5,764,587
[45] Date of Patent: Jun. 9, 1998

[54] STATIC WORDLINE REDUNDANCY MEMORY DEVICE

[75] Inventors: Stefan Buettner, Sindelfingen; Jürgen Pille, Stuttgart; Dieter Wendel, Schönaieh; Friedrich Christian Wernicke, Holzgerlingen, all of Germany

[73] Assignee: International Business Machines Corporation, Armonk, N.Y.

[21] Appl. No.: 765,987

[22] PCT Filed: Jun. 7, 1995

[86] PCT No.: PCT/EP95/02183
§ 371 Date: Jan. 10, 1997
§ 102(e) Date: Jan. 10, 1997

[87] PCT Pub. No.: WO96/41264
PCT Pub. Date: Dec. 19, 1996

[51] Int. Cl.$^6$ .................................................. G11C 8/00
[52] U.S. Cl. .............................. 365/230.06; 365/200
[58] Field of Search .......................... 365/200, 230.03, 365/230.06

[56] References Cited

U.S. PATENT DOCUMENTS 5,146,429 9/1992 Kawai et al. ........................... 365/200
5,581,508 12/1996 Sasaki et al. .......................... 365/200
5,581,509 12/1996 Golla et al. ........................... 365/200
5,621,690 4/1997 Jungroth et al. ....................... 365/200

FOREIGN PATENT DOCUMENTS 0 361 404 A  4/1990  European Pat. Off.
0 401 957 A 12/1990  European Pat. Off.

*Primary Examiner*—David C. Nelms
*Assistant Examiner*—Hoai Ho
*Attorney, Agent, or Firm*—M. A. Ehrlich

[57] ABSTRACT

The invention relates to a memory device comprising a set of word decoders W, a set of wordline drivers WL, a plurality of switches S to connect a subset of the wordline drivers to the set of word decoders and storage means 5 for the storage of information indicative of a defective wordline. The wordline drivers include a predefined subset of wordline drivers which are to be used when none of the wordlines are defective and a plurality of second subsets of wordline drivers which are to be used when one of the wordlines is defective. The memory device further includes logic means 4 for logically and permanently assigning one of the subsets to the set of word decoders in response to the information stored in the storage means, by controlling the switches S to connect one of the second subsets of wordline drivers to the set of word decoders.

12 Claims, 5 Drawing Sheets

| FUSADR | ASDL0 | ASDL1 | ASDL2 | ASDL3 |
|---|---|---|---|---|
| B0 |  | A0 |  | A0 |
| B1 |  |  | A1 | A1 |
| B2 |  |  |  |  |
| B3 |  |  |  |  |
| B4 |  |  |  |  |
| $\overline{B0}$ | A0 |  | A0 |  |
| $\overline{B1}$ | A1 | A1 |  |  |
| $\overline{B2}$ | A2 | A2 | A2 | A2 |
| $\overline{B3}$ | A3 | A3 | A3 | A3 |
| $\overline{B4}$ | A4 | A4 | A4 | A4 |

FIG.4

STATIC WORDLINE REDUNDANCY MEMORY DEVICE

The present invention relates to a memory device and method implementing wordline redundancy without an access time penalty.

The application of wordline redundancy to enhance the yield for memory arrays is an accepted fact throughout the semiconductor industry. To be attractive, wordline redundancy should occur without major impact to chip performance (e.g. access time), power requirements or size. Numerous approaches have been proposed with varying degrees of success; for example:

U.S. Pat. No. 4,365,319, issued to Takemae on Dec. 21, 1982, implements redundancy by utilizing two kinds of decoders and drivers, i.e., a PROM decoder for determining whether an incoming address is a defective address, a redundancy driver for driving a redundancy array, and row address decoders and drivers for driving a main memory cell matrix. A first embodiment of the Takemae teachings (FIG. 1) is disadvantageous in that the switch 7 results in an access time penalty and results in a semiconductor space penalty because the switch must be large to handle high currents. In a second embodiment (FIGS. 2–4), multiple AND gates $D_0$–$D_{63}$ replace the large switch 7 (FIG. 1); however, this is not much of an improvement because the memory device still suffers from both an access time (i.e., an AND-gate) penalty, and also a semiconductor space penalty as the collective area of the AND gates $D_0$–$D_{63}$ is still large. A third embodiment (FIGS. 5–10) suffers an access time penalty due to AND-gate delays introduced by the incorporation of AND gates $D_{91}$–$D_{94}$ and (FIG.6) and AND gates $D_0$–$D_3$ (FIG. 8A) to control the activation of the decoders and drivers 9 and 10, respectively.

U.S. Pat. No. 3,753,244, issued to Sumilas et al. on Aug. 14, 1973, implements redundancy by placing an extra line of memory cells on a memory chip together with a defective address store and a comparator circuit for disabling a defective line of cells and replacing it with the extra line of cells.

The Intel 2164A 64K DRAM represents a memory device where access time is the same whether it is the normal wordlines or the redundancy wordlines which are being used; however, this product is always affected by an access time penalty, whether repaired with wordline redundancy or not, because chip timing is set up to allow for redundancy repairs. More specifically, chip performance is slowed due to the need to deselect a faulty wordline's word decoder after the redundant word decoders sense a match with an incoming address. Once the match is sensed, a deselect generator is fired to deselect the entire row of normal word decoders. After the faulty wordline word decoder is deselected, then the wordline drive is enabled. Further discussions concerning the 2164A can be seen in the Intel Application Description AP-131, pp. 14–16, and "An Analysis of the 12164A", Mosaid Incorporated, p. 5, 41–52, April 1982. In addition, it should be further noted that IBM has a 72K DRAM which utilizes a similar approach.

The Bell Lab 64K DRAM (described by R. T. Smith, J. D. Chilipala, J. F. M. Bindels, R. G. Nelson, F. H. Fischer And T. F. Mantz, in "Laser Programmable Redundancy and Yield Improvement in a 64K DRAM", IEEE Journal of Solid-State Circuits, Vol. SC-16, No. 5, pp. 506–514, October 1981), and the 256K DRAM (described by C. A. Benevit, J. M. Cassard, K. J. Dimmler, A. C. Dumbri, M. G. Mound, F. J. Procyk, W. R. Rosenzweig and A. W. Yanof, in "A 256 k Dynamic Random Access Memory", IEEE Journal of Solid-State Circuits, Vol. SC-17, No. 5, pp. 857–861, October 1982), implement wordline redundancy without an access time impact by using laser-fused redundancy on the wordline pitch. No access time penalty is incurred because the defective wordline is permanently disconnected by exploding a programmable link in the wordline. This method of redundancy is disadvantageous because the tighter design rules of present and future high density memory products are causing a shrinkage in the wordline pitch, the result is a requirement for a laser spot size and laser beam position accuracy beyond what is available from laser programming systems today. Thus, laser-fused redundancy is disadvantageous in that the current level of laser technology requires an off wordline pitch method or an increase in memory chip size due to the need for an increased wordline pitch.

The IBM 32K DRAM (described by B. F. Fitzgerald and E. P. Thoma, in "Circuit Implementation of Fusible Redundant Addresses on RAMs for Productivity Enhancement", IBM Journal of Research and Development, Vol. 24, No. 3, pp. 291–295, May 1980) implements wordline redundancy without an access time penalty by adding separate sense amplifier columns for the redundant wordlines. No access penalty is incurred because the redundant wordline and the defective wordline operate in parallel, and the selection of the redundant, versus the normal sense amplifiers, occurs during the sensing operation. This approach is disadvantageous in that chip size is significantly increased due to the need for additional latches for each bitline along the redundant wordline.

Similarly, R. P. Cenker, D. G. Clemons, W. R. Huber, J. B. Petrizzi, F. J. Procyk and G. M. Trout, in "A Fault-Tolerant 64K Dynamic Random Access Memory", IEEE Transactions on Electron Devices, Vol. ED-26, No. 6, June 1979, teach a word redundancy technique having no access time penalty, but requiring that disabling fuses be placed within each redundant and non-redundant decoder, thus significantly increasing the required chip area.

B. F. Fitzgerald and D. W. Kemerer, in "Memory System With High-Performance Word Redundancy", IBM Technical Disclosure Bulletin, Vol. 19, No. 5, October 1976, describe an implementation of word redundancy with no access penalty by accessing both a normal and redundant row in independent arrays. Selection of good data is made at the data out buffers.

From EP-A-0 336 101 a semiconductor memory device and method for implementing wordline redundancy is known. A redundant word decoder compares an incoming address signal with a list of defective addresses and, in response to the comparison, produces at least one comparison signal to control the propagation of a redundant driver signal along at least one redundant wordline. A main trigger receives the comparison signal and, in response thereto, triggers the firing of a main wordline driver to produce a main driver signal. The main wordline driver and the redundant word decoder are responsive to opposite states of the comparison signal, such that for a given comparison signal, only one of the main driver signal and redundant driver signal is applied to a memory array.

From EP-A-0 029 322 a semiconductor device, in which a redundancy memory cell array is incorporated with a main memory cell matrix, is known. One memory cell array is selected by two kinds of decoders and drivers. When the redundancy memory cell array is selected by a decoder, the decoder disables one kind of the decoders and drivers directly and, as a result, the other kind of the decoders and drivers are also disabled.

A semiconductor memory device wherein a redundancy memory cell array incorporated with main memory cell matrixes is disclosed in U.S. Pat. No. 4,392,211. Memory cells of the main memory cell matrixes are selected by first and third decoders while memory cells of the redundancy memory cell array are selected by second and third decoders. When the redundancy memory cell array is selected by the second decoder, the transmission of a clock signal to the first decoders is stopped by a switching circuit.

While the above approaches represent important advances in semiconductor manufacturing technology, there still exists a need for an improved memory device and approach which are able to provide wordline redundancy. It is therefore an object of the invention to provide an improved memory device and method to implement wordline redundancy.

The object of the invention is solved by the features set forth in the independent claims.

The inventive memory device comprises a set of word decoders and a set of wordline drivers. The number of the wordline drivers is greater than the number of the word decoders. This implies that the physical real address space is larger than the addressable address space because each wordline driver is connected to a different wordline. If one or more of the wordlines are defective a subset of the wordline drivers is selected which does not comprise the wordline drivers belonging to the defective wordlines. This set of wordline drivers is different from the normal set of wordline drivers which is used when no wordline is defective.

The memory device further comprises a storage means for storage of information indicative of a defective wordline. This can be realized by a "Fuse address". Once the memory device has a power supply voltage applied thereto such a subset of wordline drivers is selected by a logic means according to the information indicative of a defective wordline. The subset which is selected by the logic means is permanently assigned to the set of word decoders. Furthermore the logic means control the switches between the word decoders and wordline drivers to connect the subset of wordline drivers which is selected by the logic means to the set of word decoders. Thereby each wordline driver of the selected subset of wordline drivers is permanently connected to a specific one of the word decoders.

The selection and connection of the wordline drivers is already accomplished before the memory device is operated, e.g. to read and write data. Once the permanent connection of the wordline drivers is established no further steps are necessary in order to implement the wordline redundancy because the connections of the wordline drivers to the word decoders are static. Hence, no further decoding or switching operations have to take place when the memory device is actually operated to read or write data.

In principal, the number of redundant wordlines is not restricted by the invention. If, for example, there is only one redundant wordline, this requires also one additional switch. Therefore a number n of word decoders requires a number n+1 of wordline drivers of the n+1 wordlines and a number n+1 of switches because each wordline driver requires one switch.

In the example considered here the logic means has to generate 3 possible control states for each of the switches: a first control state indicates that the corresponding switch has to be connected to its "normal" word decoder to which the switch is also connected when there is no defective wordline.

A second control state indicates that the corresponding switch should disconnect its associated wordline driver from the word decoders, because the wordline driver belongs to a defective wordline and is to be replaced by another wordline driver. Thereby the wordline driver belonging to a defective wordline is disabled. This can be accomplished by grounding the wordline driver.

The 3rd state of the logic means indicates that the corresponding switch does not have to connect its wordline driver to the "normal" word decoder to which the wordline driver is connected when there is no defective wordline. In this case the wordline driver is connected to another word decoder which is not already connected to a wordline driver via a switch being in the first control state. This can be for example the word decoder which precedes the "normal" word decoder to which the wordline driver is connected when there is no defective wordline. This principle of operation can analogously be realized for two or more redundant wordlines.

A computer system incorporating a memory device according to the invention features improved speed of operation as compared to the prior art because the implementation of wordline redundancy results in no performance penalty. Furthermore, the invention is advantageous in that the realization of the inventive principle does only require relatively few electrical components and—as a consequence—requires only relatively little space on the chip.

In the following one way of carrying out the invention is shown in more detail with reference to the drawings in which:

FIG. 1 schematically shows the connection of the word decoders and the wordline drivers via the switches;

FIG. 2 schematically shows the realization of the logic means comprising a plurality of logic blocks;

FIG. 4 shows in more detail the realization of the decoder which is incorporated in the logic block;

Figure 1:
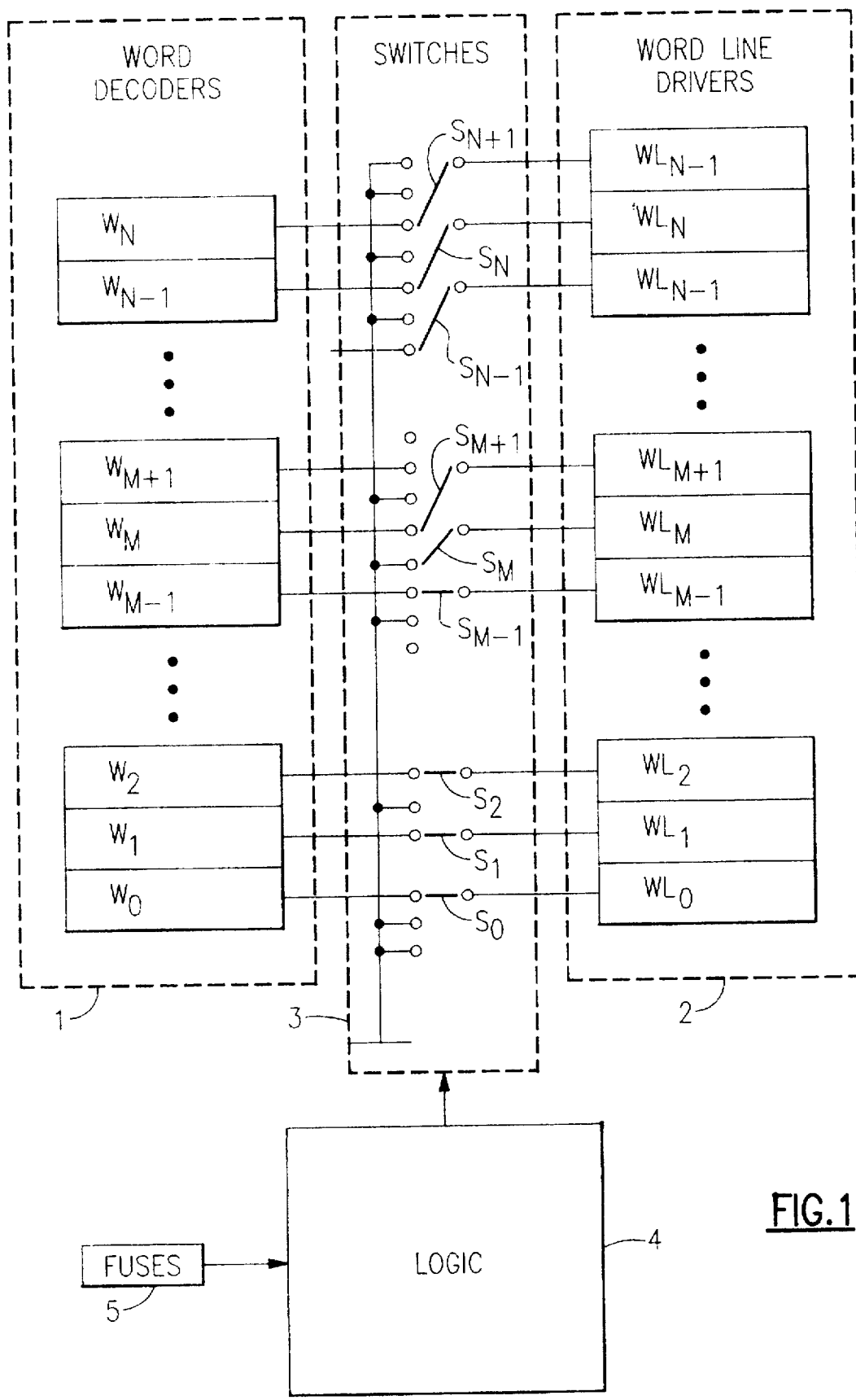

As it is shown in FIG. 1 a set of word decoders 1 is connected to a subset of the set of wordline drivers 2 via a plurality of switches 3. In the example considered here the set of word decoders comprises the word decoders W0, W1, W2, . . . , Wm−1, Wm, Wm+1, . . . , Wn−1, Wn. The set of wordline drivers 2 comprises the wordline drivers WL0, WL1, WL2, . . . , WLm−1, WLm, WLm+1, . . . , WLn−1, WLn, WLn+1. Each of the wordline drivers WL of the set of wordline drivers 2 is connected to one wordline. The wordlines are not shown in the drawing. Since the number of wordline drivers WL is greater than the number of word decoders the physical addressed space is larger than the addressable address space. In the case considered here there is one more wordline driver than there are word decoders.

Each wordline driver WL has one of the switches of the plurality of switches 3 associated thereto. The switch S0 of the plurality of switches 3 is connected to WL0, S1 to WL1, S2 to WL2, . . . , Sm−1 to WLm−1, Sm to WLm, Sm+1 to WLm+1, . . . , Sn−1 to WLn−1, Sn to WLn and Sn+1 to WLn+1. The number of switches S is equal to the number of wordline drivers WL.

In the example considered here the wordline WLm is assumed to be defective. As a consequence the switch Sm of the wordline driver WLm connects the wordline WLm to ground—are in other words—the switch Sm disconnects the defective wordline driver WLm from the set of word decoders 1 and thus disables the wordline driver WLm.

This situation is different from the normal situation when there is no defective wordline driver. In the normal case each word decoder of the set of word decoders 1 is connected to a wordline driver of a predefined first subset of the set of wordline drivers 2. In this example the predefined first subset of wordline drivers for the normal case is the set of wordline drivers WL0, WL1, WL2, . . . , WLn−1, WLn. Hence, in the normal operation mode the word decoder W0 is connected to the wordline driver WL0, W1 to WL1, W2 to WL2, . . . Wm−1 to WLm−1, Wm to WLm, Wm+1 to WLm−1, . . . , Wm−1 to WL−1 and Wn to WLn. The wordline driver WLn+1 is connected to ground by its switch Sn+1 and is thus disabled.

The situation shown in FIG. 1 is not the normal situation when there is no defective wordline driver. Since in the case shown in FIG. 1 one of the wordline drivers—in this example WLm—is defective the addressable addressed space has to be distributed differently in the physical address space as compared to the normal situation. This is accomplished by connecting the word decoders W of the set of word decoders 1 to a second subset of wordline drivers of the set of wordline drivers 2. The second subset consists of the entire set of wordline drivers 2 except the defective wordline driver WLm.

The word decoders W0 to Wm−1 are connected to the respective wordline drivers WL0 to WLm−1 like in the normal situation when there is no defective wordline driver. As opposed to this the word decoders Wm to Wn are connected to the wordline drivers WLm+1 to WLn+1. This is because the wordline WLm is defective and disabled by the switch Sm. The wordline driver WLn+1 is no longer disabled but connected to the word decoder Wn via the switch Sn+1. Thereby the functionality of the defective wordline driver WLm is replaced.

The memory device shown in FIG. 1 further comprises logic means 4 which is connected to the plurality of switches 3 to control each of the switches S0 to Sn+1. The control logic 4 is connected to a storage device 5. If there is a defective wordline the storage device 5 has the address of the defective wordline and of the corresponding wordline driver stored therein. In the example considered here the address Am of the wordline m and thus the address of the wordline driver WLm is stored in the storage device 5. The storage device 5 can be realized by a number of fuses which are programmed after the testing of the memory device.

Figure 2:
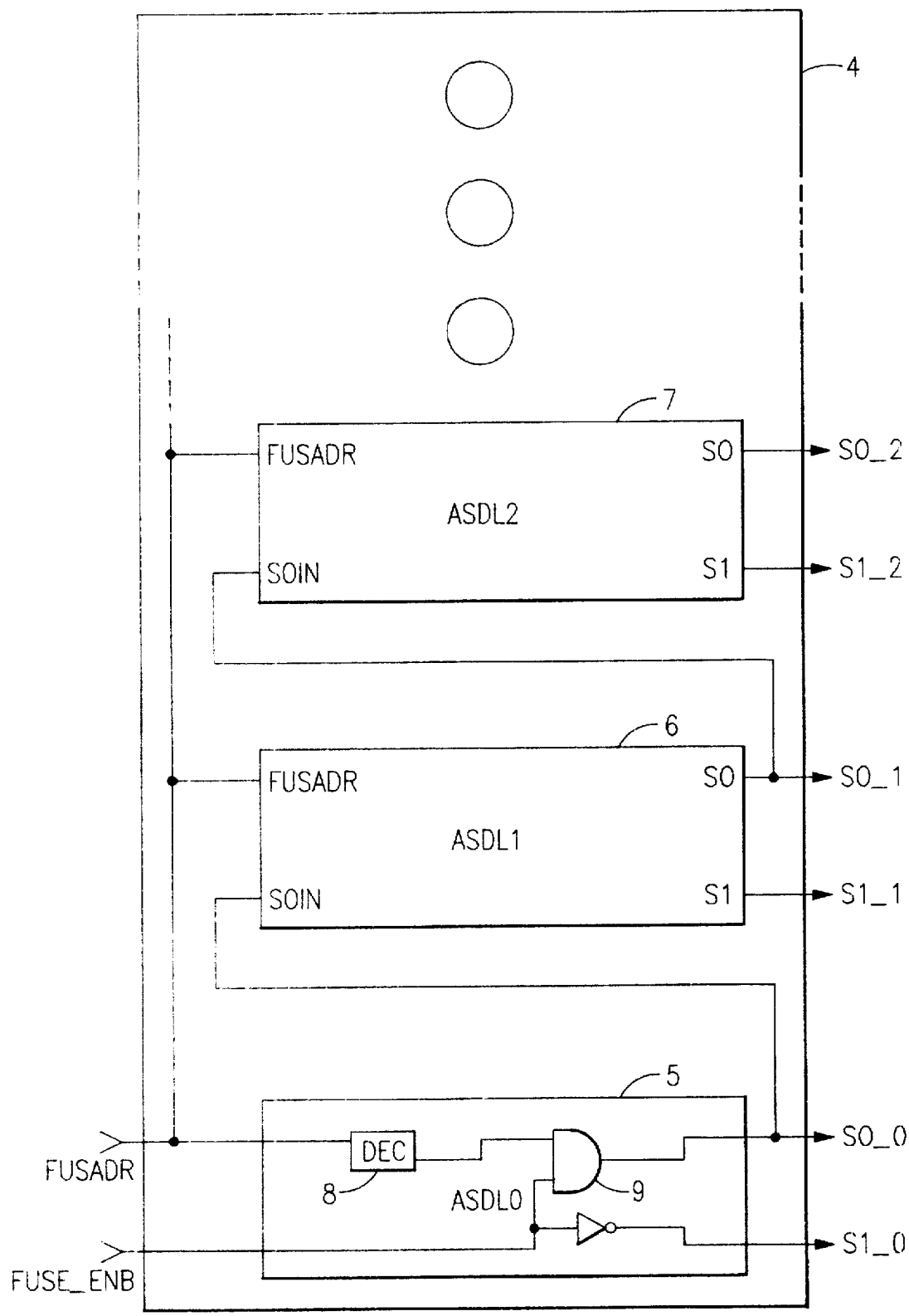

FIG. 2 shows an overview of one realization of the control logic 4. The control logic 4 comprises a plurality of address space distribution logic blocks 5, 6, 7, . . . . For each switch S of the plurality of switches 3 there is one such address space distribution logic block (ASDL). The logic block 5 (ASDL0) belongs to the switch S0, the logic block 6 (ASDL1) to S1 and the logic block 7 (ASDL2) to S2. The further logic blocks ASDL3 to ASDLn+1 which belong to the switches S3 to Sn+1, respectively, are not shown in FIG. 2. Each of the logic blocks has an input FUSADR which is connected to the storage device 5 for inputting of the address Am. Furthermore each of the logic blocks has a decoder 8. The decoder 8 issues a signal if the address Am corresponds to the address of the wordline to which the wordline driver of the switch to which the logic block belongs matches. This results in two output signals S0 and S1 per logic block. The switch S0 is controlled by the output signals of its logic block 5 (ASDL0) S0_0 and S1_0. Analogously the switches S1 and S2 are controlled by the output signals S0_1, S1_1 and S0_2, S1_2, respectively. The further output signals S0_3, S1_3 to S0_n+1 to S1_n+1 are not shown in FIG. 2.

If the signal S0_x equals logically 1 and the signal S1_x equals logically 0 this means that the corresponding wordline driver WLx has to be connected by the switch Sx to the normal word decoder Wx. If both of the signals S0_x and S1_x equal logically 0 the switch Sx is controlled to disable the wordline driver WLx. If the signal S0_x equals logically 0 and the signal S1_x equals logically 1 the switch Sx is controlled to connect the wordline driver WLx to the word decoder Wx−1.

The logic block 5 has a further input signal FUSE_ENB applied thereto. The input signal FUSE_ENB is logically 1 where there is a defective wordline. In the opposite case FUSE_ENB is logically 0. If FUSE_ENB is logically 0 this signal passes through the AND gate 9 to the corresponding input S0IN of the next logic block 6. As a consequence the input signal FUSE_ENB propagates through all of the logic blocks.

Figure 3:
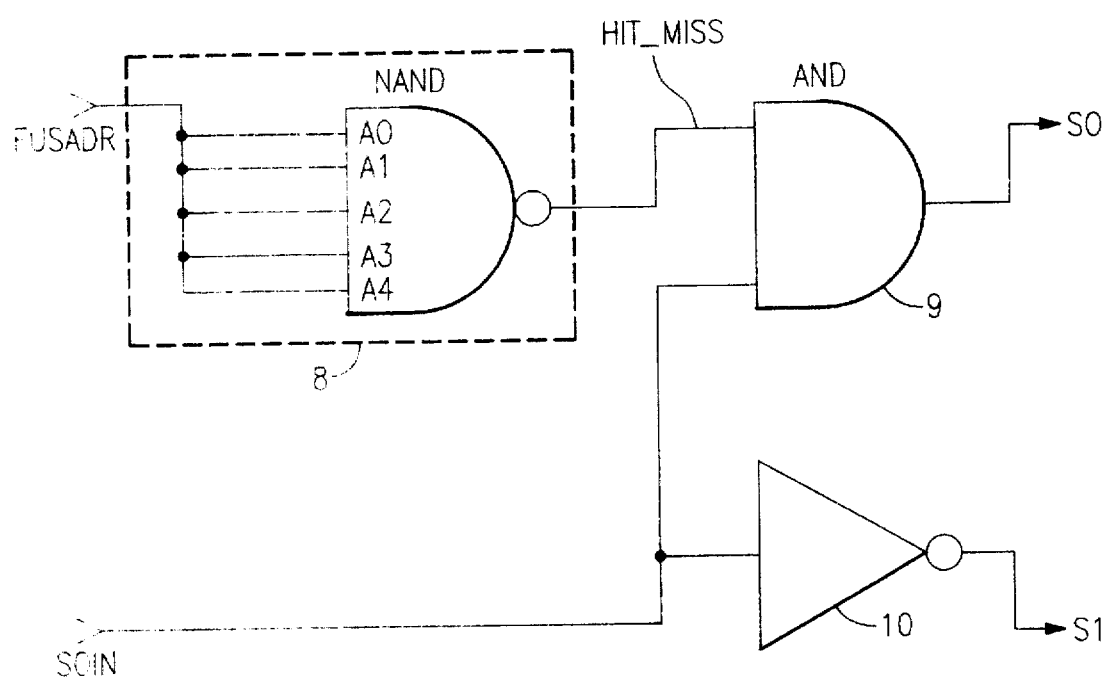
FIG. 3 is a circuit diagram showing in more detail the realization of one of the logic blocks.

By way of example FIG. 3 shows one of the logic blocks, logic block 5, in more detail. It is to be understood that the circuit diagram for all of the logic blocks is identical.

The logic block 5 comprises the decoder 8, the AND gate 9 and an inverter 10. The input signal FUSADR is inputted to the decoder 8. If the address stored in storage device 5 and thus the signal FUSADR matches the address Am of the wordline m to which a logic block ASDLm belongs the decoder 8 will issue a signal HIT_MISS. In the case of a match of the addresses the signal HIT_MISS is logically 0.

For the logic block 5 the signal HIT_MISS is logically 0 when the address stored in the storage device 5 is the address A0 of the wordline 0. The signal HIT_MISS is inputted to the AND gate 9 as well as the further input signal S0IN. In the case of the logic block 5 the input signal S0IN is the signal FUSE_ENB. The fuse enable signal FUSE_ENB is logically 0 if there is no defective wordline. In this case the output of AND gate 9 and thus S0_0 is always logically 0 irrespective of the condition of the signal HIT_MISS.

If the signal FUS_ENB is logically 1 this indicates that there is a defective wordline. In this case the output of the AND gate 9 depends on the signal HIT_MISS. An inverter 10 is connected to the input S0IN to produce the output S1_0.

In the example considered here there is an address space of 5 bits. Correspondingly the decoder 8 has a NAND gate having 5 inputs A0, A1, A2, A3 and A4. The signal FUSADR comprises the address bits B0 to B4 and the complements of the address bits $\overline{B0}$ to $\overline{B4}$. Whether the true or complement bits of FUSADR are connected to one of the inputs of the NAND gate of the decoder 8 depends on the address Am to which the logic block to which the decoder 8 belongs is assigned.

This is explained in more detail with reference to FIG. 4. The first column in FIG. 4 indicates the bit positions of the signal FUSADR, i.e. B0 to B4 and $\overline{B0}$ to $\overline{B4}$. The second column in FIG. 4 indicates which of the inputs A0 to A4 of the NAND-gate of the logic block 5 (ASDL0) are connected to which bits of the input signal FUSADR. In the ASDL0 only the complement bits $\overline{B0}$ to $\overline{B4}$ are used. $\overline{B0}$ is connected to A0, $\overline{B1}$ to A1, $\overline{B2}$ to A2, $\overline{B3}$ to A3 and $\overline{B4}$ to A4.

If one assumes that the wordline 0 having the address 00000 is defective this results in an input 11111 to the NAND gate of the decoder 8 of the ASDL0. Hence the signal HIT_MISS of the ASDL0 is logically 0 which indicates that an address match occurs. Analogously the bit B0 of FUSADR is connected to the input A0 of the NAND-gate of the decoder 8 of the ASDL1 whereas the inputs of A1 to A4 remain unchanged. The same principle applies to the connection of the bit positions of the signal FUSADR to the further logic blocks ASDL2, ASDL3, . . . , ASDLn+1.

Figure 5:
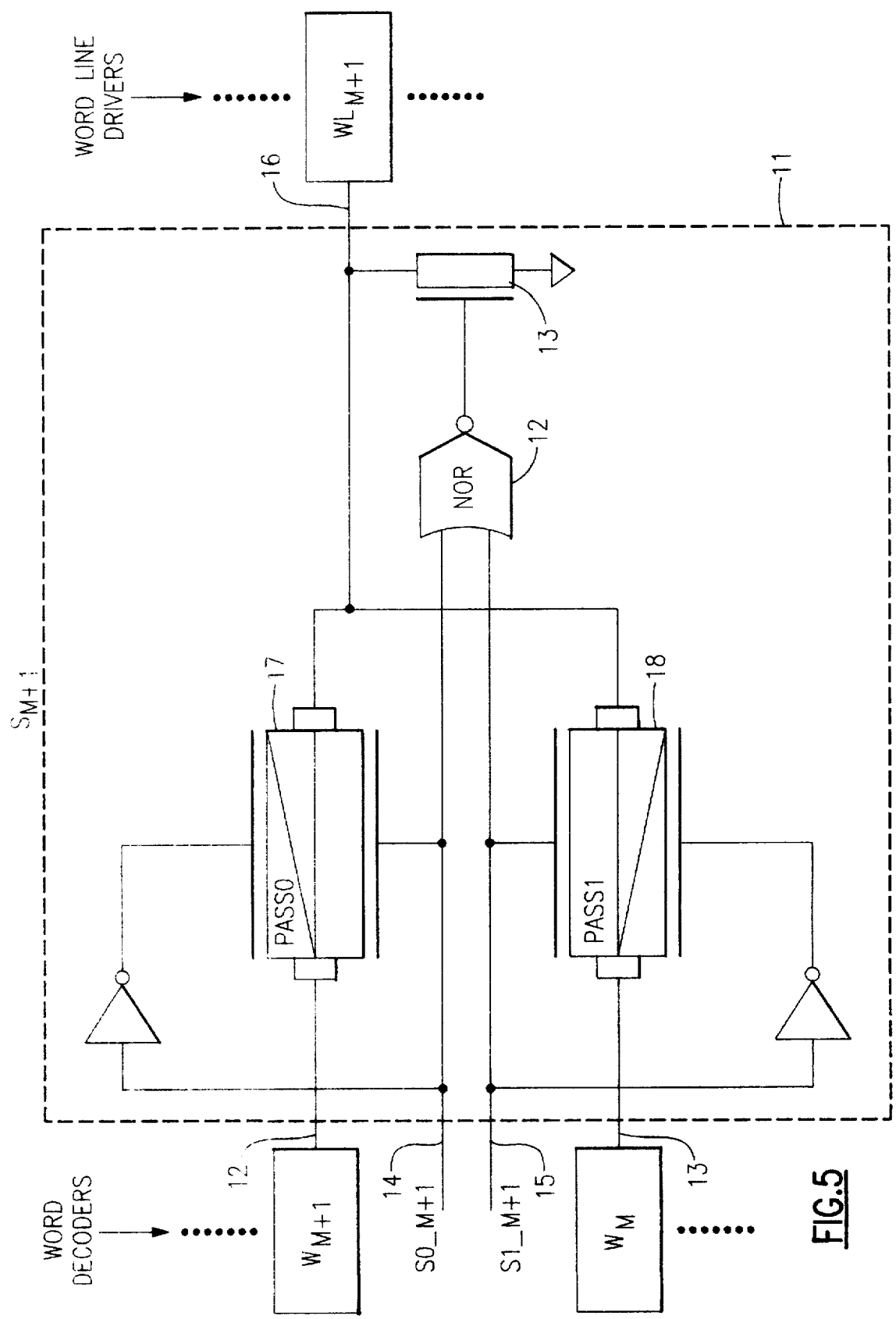
FIG. 5 is a circuit diagram showing the realization of one of the switches.

FIG. 5 shows one implementation of a switch S. By way of example the switch 11 shown in FIG. 5 is considered to be the switch Sm+1. The switch Sm+1 has inputs 12 and 13 which are connected to the word decoders Wm+1 and Wm. Furthermore the switch Sm+1 is connected to the signals S0__m+1 and S1__m+1 of its ASDLm+1 at inputs 14 and 15. The output 16 of the switch Sm+1 is connected to the wordline driver WLm+1 of this switch. The switch Sm+1 serves to selectively establish a connection between the word decoders Wm+1 or Wm and the wordline driver WLm+1 depending on the conditions of the control signals S0__m+1 and S1__m+1. If the wordline driver WLm+1 belongs to a defective wordline m+1 the switch Sm+1 is to disable the wordline driver WLm+1. This is accomplished by means of the internal circuit of the switch Sm+1 as shown in FIG. 5.

The control signals S0__m+1 and S1__m+1 are connected to the NOR-gate 12. The output of the NOR-gate 12 is connected to the base of a transistor 13. One terminal of the transistor 13 is connected to the output 16 whereas the other terminal of the transistor 13 is connected to ground. If an address match of the address stored in the storage device 5 and the wordline m+1 occurs this results in the control signals S0__m+1 and S1__m+1 to both equal logically 0 (cf. FIG. 3 and FIG. 4). As a consequence the output of the NOR-gate 12 is logically 1 so that the transistor 13 connects the output 16 of the switch Sm+1 to ground. As a consequence the wordline driver WLm+1 disconnected from the word decoders and is disabled.

Furthermore the switch Sm+1 has pass gates 17 and 18. The pass gate 17 has one terminal connected to the input 12 and thus to the word decoder Wm+1. The other terminal of the pass gate 17 is connected to the output 16 and thus to the wordline driver WLm+1. The pass gates 17 and 18 consist of two complementary transistors according to the CMOS technology employed for the realization of this preferred embodiment. The gates of the transistors of the pass gate 17 are connected to the input 14 whereby the P-type transistor of the pass gate 17 has an inverter interconnected in the signal path. The same applies analogously to the pass gate 18. The gates of the pass gate 18 are connected to the input 15 and thus to the control signal S1__m+1. If both of the control signals equal logically 0 both of the pass gates 17 and 18 are not conductive so that no connection is established between the word decoders and the wordline driver WLm+1. If the control signal S0__m+1 is logically 1 the word decoder Wm+1 is connected to the wordline driver WLm+1. In this case the control signal S1__m+1 is logically 0 since only one of the word decoders can be connected to the wordline driver WLm+1 at a time.

If the control signal S0__m+1 is logically 0 and the control signal S1__m+1 is logically 1 this results in the word decoder Wm to be connected to the wordline driver WLm+1. This situation corresponds to the case shown in FIG. 1.

The switching operations of the switches take place already when a power supply voltage is applied to the memory device. Once the connections between word decoders and wordline drivers have been established via the switches under the control of the control logic 4 these connect ions remain unchanged—at least as long as power supply voltage is applied to the memory device. As a consequence there is no access time penalty since no switching or decoding operation has to be carried out "on the fly" when the memory device is used to carry out read/write operations. The information that a wordline is defective is stored on the memory device after the testing of the device in order to program the signal FUSE_ENB as well as the address of the defective wordline in order to program the signal FUSADR.

We claim:

1. A memory device comprising a set of word decoders (1), a set of wordline drivers (2), a plurality of switches (3) to connect a subset of said wordline drivers to said set of word decoders and storage means (5) for storage of information indicative of a defective wordline, wherein said set of wordline drivers further comprise:
   a predefined first subset of wordline drivers which are to be used when no wordline is defective, and a plurality of second subsets of wordline drivers which are to be used when one of said wordlines is defective; and
   wherein said memory device further comprises logic means (4) for statically assigning one of said subsets of wordline drivers to said set of word decoders in response to the information stored in said storage means by controlling said switches before said memory device is operated to read or write data, and wherein said assigning enables said memory device to be operated to read or write data without further reference to said storage means and without further reference to said logic means.

2. The memory device according to claim 1 comprising a number n of word decoders, a number n+1 of wordline drivers and a number n+1 of switches S, wherein said switches S take the following states in response to the control of said logic means:
   a) if none of said wordlines is defective:
      each switch Si connecting a wordline driver i to a corresponding word decoder i, where $0<i<n$, the switch Sn+1 disconnecting the wordline driver n+1; and
   b) if a wordline m of said wordlines is defective:
      each switch Si connecting a wordline driver i to a corresponding word decoder i, where $0<=i<m$;
      a switch Sm disconnecting said wordline driver m;
      each switch Si connecting a wordline driver i+1 to a corresponding word decoder i, where $m<i<=n+1$.

3. The memory device according to claim 2 wherein said logic means further comprises a plurality of n+1 logic blocks (ADSL), and wherein each of said logic blocks is assigned to one of said switches S and wherein each of said logic blocks may generate a control signal for the switch Si to which said logic block is assigned.

4. The memory device according to claim 3 wherein each of said logic blocks further includes an input for receiving the address Am of the defective wordline and a decoding means (8) for issuing a signal (HIT_MISS) if said received address Am corresponds to the wordline driver m to which said logic block is assigned.

5. The memory device according to claim 3 each of said logic blocks being adapted to generate two control signals S0 and S1 for the switch S to which said logic block is assigned, each of said logic blocks having an enable input (S0IN), only one of said blocks being adapted to be connected to an enable signal (FUSE_ENB), whereas the remaining blocks are adapted to receive one of said control signals of another one of said logic blocks at their respective enable inputs.

6. The memory device according to claim 1 wherein said storage means is a ROM.

7. An integrated circuit chip incorporating the memory device according to claim 1.

8. A computer system comprising the memory device according to claim 1.

9. A method for realizing wordline redundancy in the memory device according to claim 1, comprising the steps of:

a) storing information indicative of a defective wordline if at least one of said wordlines is defective; and b) permanently connecting one of said subsets of wordline drivers to said set of word decoders, wherein said connecting enables operation of said memory device without further reference to said storage means and without further reference to said logic means.

10. A memory device comprising a set of word decoders (1), a set of wordline drivers (2), a plurality of switches (3) to connect a subset of said wordline drivers to said set of word decoders and storage means (5) for storage of information indicative of a defective wordline, wherein said set of wordline drivers further comprise:

a predefined first subset of wordline drivers which are to be used when no wordline is defective, and a plurality of second subsets of wordline drivers which are to be used when one of said wordlines is defective;

wherein said memory device further comprises logic means (4) for statically assigning one of said subsets of wordline drivers to said set of word decoders in response to the information stored in said storage means by controlling said switches in accordance with said stored information; and wherein said logic means further includes a plurality of n+1 logic blocks (ADSL), and wherein each of said logic blocks is assigned to one of said switches S and wherein each of said logic blocks may generate a control signal for the switch Si to which said logic block is assigned.

11. The memory device according to claim 10 wherein each of said logic blocks further includes an input for receiving the address Am of the defective wordline (m) and a decoding means (8) for issuing a signal (HIT_MISS) if said received address Am corresponds to the wordline driver m to which said logic block is assigned.

12. The memory device according to claim 10 wherein each of said logic blocks may generate two control signals S0 and S1 for the switch S to which said logic block is assigned, each of said logic blocks having an enable input (S0IN), and wherein only one of said logic blocks is capable of coupling to an enable signal (FUSE_ENB), and wherein the remaining logic blocks are adapted to receive one of said control signals of another one of said logic blocks at their respective enable inputs.

* * * * *